(12) United States Patent
Morita

(10) Patent No.: US 9,832,403 B2
(45) Date of Patent: Nov. 28, 2017

(54) SOLID-STATE IMAGING DEVICE, ELECTRONIC APPARATUS, AND INSPECTION APPARATUS

(71) Applicant: Sony Semiconductor Solutions Corporation, Kanagawa (JP)

(72) Inventor: Ryuhei Morita, Kagoshima (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 14/454,129

(22) Filed: Aug. 7, 2014

(65) Prior Publication Data

US 2015/0049224 A1 Feb. 19, 2015

(30) Foreign Application Priority Data

Aug. 15, 2013 (JP) ................... 2013-168948

(51) Int. Cl.
*H04N 5/369* (2011.01)
*H01L 27/146* (2006.01)
*H01L 29/10* (2006.01)
*H01L 29/66* (2006.01)

(52) U.S. Cl.
CPC ..... *H04N 5/3696* (2013.01); *H01L 27/14616* (2013.01); *H01L 29/105* (2013.01); *H01L 29/66803* (2013.01)

(58) Field of Classification Search
None
See application file for complete search history.

(56) References Cited

U.S. PATENT DOCUMENTS

| 5,521,639 | A | * | 5/1996 | Tomura | H01L 27/14831 257/E27.154 |
| 6,795,118 | B1 | * | 9/2004 | Cho | H04N 17/002 348/246 |
| 2011/0279727 | A1 | * | 11/2011 | Kusaka | H01L 27/14621 348/340 |
| 2012/0113304 | A1 | * | 5/2012 | Chen | H01L 27/14621 348/280 |

\* cited by examiner

*Primary Examiner* — Mark T Monk
(74) *Attorney, Agent, or Firm* — Sheridan Ross P.C.

(57) ABSTRACT

A solid-state imaging device includes a first pixel and a second pixel. The first pixel includes a light-shielding part having an opening of a predetermined size. The second pixel includes a light-shielding part having an opening of the predetermined size at a position different from a position of the opening of the first pixel.

20 Claims, 12 Drawing Sheets

SOLID-STATE IMAGING DEVICE, ELECTRONIC APPARATUS, AND INSPECTION APPARATUS

CROSS REFERENCE TO RELATED APPLICATIONS

This application claims the benefit of Japanese Priority Patent Application JP 2013-168948 filed Aug. 15, 2013, the entire contents of which are incorporated herein by reference.

BACKGROUND

The present disclosure relates to a solid-state imaging device, an electronic apparatus, and an inspection apparatus, and more particularly, to a solid-state imaging device, an electronic apparatus, and an inspection apparatus that are capable of more accurately measuring characteristics.

In the past, there has been known a solid-state imaging device that receives light input from a subject, performs photoelectric conversion on the light, and outputs an image formed of pixel data obtained as a result of the photoelectric conversion. In the solid-state imaging device, a photoelectric conversion unit performs the photoelectric conversion on the received light, and charge obtained by the photoelectric conversion is read out by a readout gate and transferred to the outside via a transfer gate.

Additionally, the following solid-state imaging device is proposed: in order to completely transfer the charge from the photoelectric conversion unit to the readout gate and to shorten a reading time to the readout gate, for example, impurities are injected to the photoelectric conversion unit to provide an inclined electric field in the direction of the transfer gate (see, for example, Japanese Patent No. 3120486). Such a technique is effective particularly in a solid-state imaging device having a large pixel size or a solid-state imaging device having an elongated pixel shape.

SUMMARY

In recent years, a voltage available for the solid-state imaging device has been increasingly reduced, while there has been a demand for shortening of a reading time.

For that reason, in terms of the design of the photoelectric conversion unit, the whole potential is made shallow, while there is a growing need for increasing a potential gradient in order to ensure an electric field within the solid-state imaging device.

So, the potential of a region facing a channel stop, which is located on the opposite side of the readout gate in the photoelectric conversion unit, has no other choice but to be made shallow. Thus, a difference between the potential of the region of the photoelectric conversion unit near the channel stop and the potential of the channel stop tends to be small.

As a result, the potential of the region of the photoelectric conversion unit near the channel stop becomes substantially the same as the potential of the channel stop in some cases due to variations at the time of production, and the like. Consequently, a reduced sensitivity phenomenon is easy to occur in the region near the channel stop.

In the case where the area of a reduced sensitivity region is relatively large as compared with the entire area of the photoelectric conversion unit because of, for example, a small pixel area, there is a high possibility that a device in which the reduced sensitivity phenomenon occurs can be screened by a sensitivity measurement and a measurement of sensitivity variations for each pixel that are adopted in a production line of related art.

On the other hand, in the case where the pixel area is large but the device is used in an application program that is significantly susceptible to the influence of the reduced sensitivity region, there is a high possibility that a device assumed as an abnormal product is not screened by the sensitivity measurement and the measurement of sensitivity variations for each pixel in related art. This is because variations in sensitivity characteristics due to variations in the area of the photoelectric conversion unit are relatively small as compared with variations in outputs, which are caused by variations in quality of other circuits of the device, an upper layer film provided to the top of the photoelectric conversion unit, and the like. Thus, it is difficult to identify a reduced sensitivity by the measurement methods in related art.

If the same environment as the application program to be used is established, screening is enabled. However, it is not realistic to perform such screening in an actual production line of the solid-state imaging device.

As described above, it has been difficult to highly accurately measure characteristics such as sensitivity in the photoelectric conversion unit of the solid-state imaging device by the technique described above.

The present disclosure has been made in view of the circumstances as described above, and it is desirable to more accurately measure characteristics.

According to a first embodiment of the present disclosure, there is provided a solid-state imaging device including a first pixel and a second pixel. The first pixel includes a light-shielding part having an opening of a predetermined size. The second pixel includes a light-shielding part having an opening of the predetermined size at a position different from a position of the opening of the first pixel.

The first pixel and the second pixel may include pixels to measure characteristics of the solid-state imaging device.

The first pixel and the second pixel may include pixels to measure sensitivity characteristics of the solid-state imaging device by comparing an output signal of the first pixel and an output signal of the second pixel.

The first pixel and the second pixel may be provided on an outside of an effective pixel region of the solid-state imaging device.

The first pixel and the second pixel may be each provided on an edge portion of the solid-state imaging device.

The first pixel and the second pixel may be connected to a common circuit at a subsequent stage.

The second pixel may include a plurality of second pixels.

The first pixel may include a plurality of first pixels. The second pixel may include a plurality of second pixels. The plurality of first pixels and the plurality of second pixels may form a plurality of pairs.

The opening of the first pixel may be provided near the center of the light-shielding part. The opening of the second pixel may be provided near an end of the light-shielding part.

Each of the first pixel and the second pixel of the solid-state imaging device may include a photoelectric conversion unit having a potential, a gradient being provided to the potential in a readout direction of charge obtained in the photoelectric conversion unit.

The opening of the second pixel may have the same shape as a region having substantially the same potential in the photoelectric conversion unit and may be provided at a position corresponding to the region.

The opening of the second pixel may have the same shape as a boundary portion between regions having potentials different from each other in the photoelectric conversion unit and may be provided at a position corresponding to the boundary portion.

The solid-state imaging device may further include at least three pixels including the first pixel and the second pixel, the at least three pixels each including the light-shielding part including the opening, the openings of the at least three pixels being provided at positions different from one another.

The solid-state imaging device may include an area sensor.

In the first embodiment of the present disclosure, a first pixel including a light-shielding part having an opening of a predetermined size and a second pixel including a light-shielding part having an opening of the predetermined size at a position different from a position of the opening of the first pixel are provided to the solid-state imaging device.

According to a second embodiment of the present disclosure, there is provided an electronic apparatus including a solid-state imaging device. The solid-state imaging device includes a first pixel including a light-shielding part having an opening of a predetermined size, and a second pixel including a light-shielding part having an opening of the predetermined size at a position different from a position of the opening of the first pixel.

In the second embodiment of the present disclosure, a first pixel including a light-shielding part having an opening of a predetermined size and a second pixel including a light-shielding part having an opening of the predetermined size at a position different from a position of the opening of the first pixel are provided to the solid-state imaging device included in the electronic apparatus.

According to a third embodiment of the present disclosure, there is provided an inspection apparatus including an acquisition unit and a calculation unit. The acquisition unit is configured to acquire an output signal of a first pixel and an output signal of a second pixel, the output signals being output from a solid-state imaging device including the first pixel and the second pixel, the first pixel including a light-shielding part having an opening of a predetermined size, the second pixel including a light-shielding part having an opening of the predetermined size at a position different from a position of the opening of the first pixel. The calculation unit is configured to compare the output signal of the first pixel and the output signal of the second pixel and measure sensitivity characteristics of the solid-state imaging device.

The inspection apparatus may further include a determination unit configured to determine that a reduced sensitivity occurs in the pixel of the solid-state imaging device, when a ratio of the output signal of the first pixel and the output signal of the second pixel is a predetermined threshold value or smaller, the ratio being calculated as the sensitivity characteristics.

The threshold value may be 0.9.

The threshold value may be 0.5.

In the third embodiment of the present disclosure, an output signal of a first pixel and an output signal of a second pixel are acquired, the output signals being output from a solid-state imaging device including the first pixel and the second pixel, the first pixel including a light-shielding part having an opening of a predetermined size, the second pixel including a light-shielding part having an opening of the predetermined size at a position different from a position of the opening of the first pixel. The output signal of the first pixel and the output signal of the second pixel are compared, and sensitivity characteristics of the solid-state imaging device are measured.

According to the first to third embodiments of the present disclosure, it is possible to more accurately measure characteristics.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments to which the present disclosure is applied will be described with reference the drawings.

First Embodiment

Configuration Example of Imaging Device

Figure 1:
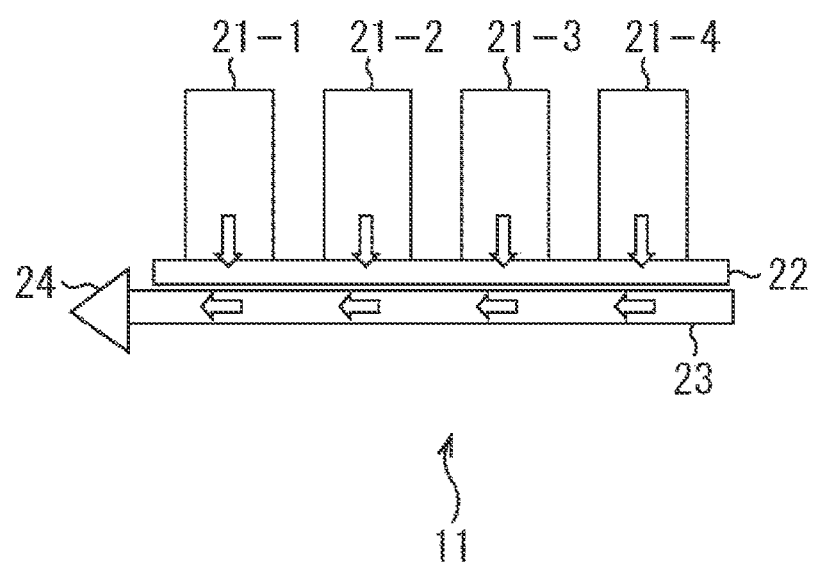
FIG. 1 is a diagram showing a configuration example of an imaging device.

FIG. 1 is a diagram showing a configuration example of an imaging device to which an embodiment of the present disclosure is applied.

An imaging device 11 to which an embodiment of the present disclosure is applied is formed of a solid-state imaging device such as a CCD (Charge Coupled Device) linear sensor.

The imaging device 11 includes pixels 21-1 to 21-4, a readout gate 22, a horizontal shift register 23, and a charge detecting unit 24.

Each of the pixels 21-1 to 21-4 is formed of a photoelectric conversion unit such as a photodiode, and receives light that is input from a subject, performs photoelectric conversion on the received light, and temporarily accumulates charge obtained as a result of the photoelectric conversion. It should be noted that hereinafter the pixels 21-1 to 21-4 are also simply referred to as pixels 21, unless the pixels 21-1 to 21-4 have to be distinguished from one another.

In this example, in FIG. 1, the pixels 21 having a long shape in a longitudinal direction are arranged in a lateral direction. Each of the pixels 21 is formed by being partitioned by a channel stop region (not shown).

The readout gate 22 transfers the charge, which have been accumulated in the pixels 21, to the horizontal shift register 23 provided adjacent to the readout gate 22. In other words, the readout gate 22 is opened and closed in accordance with an applied voltage and functions as a transfer gate that transfers the charge accumulated in the pixels 21 to the horizontal shift register 23 and stops the transfer of the charge.

The horizontal shift register 23 transfers the charge, which have been transferred from the pixels 21 via the readout gate 22, in a horizontal direction of FIG. 1 and supplies the charge to the charge detecting unit 24. The charge detecting unit 24 detects the amount of the charge from the pixels 21, the charge having been supplied from the horizontal shift register 23, and outputs electric signals corresponding to the detected amount of the charge as output signals of the respective pixels 21.

Figure 2:
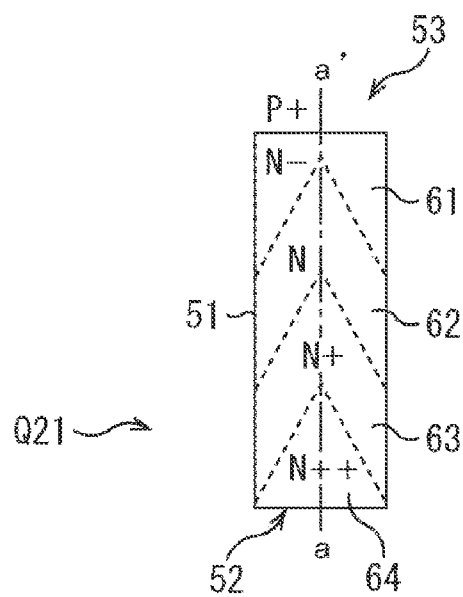
FIG. 2 is a diagram for describing a potential gradient in a photoelectric conversion unit.
Figure 2:
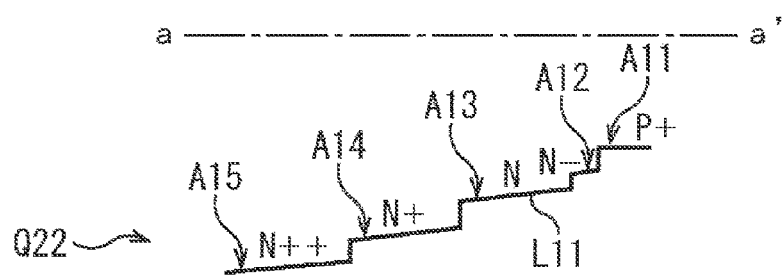

In each of the pixels 21 of the imaging device 11, more specifically, in the photoelectric conversion unit such as a photodiode constituting each pixel 21, as shown in FIG. 2, a potential gradient is provided in the direction toward the readout gate 22, that is, to the readout direction of the accumulated charge.

Specifically, as indicated by the arrow Q21, a potential (electric field) is provided with a gradient between an end 52 and the opposite end facing a P+ region 53. The end 52 is adjacent to the readout gate 22 in a photoelectric conversion unit 51 that forms the pixel 21. The P+ region 53 serves as a channel stop region.

In this example, an N-type semiconductor region that serves as the photoelectric conversion unit 51 is divided into an N− region 61, an N region 62, an N+ region 63, and an N++ region 64 by injection of impurities such as boron. Additionally, the N− region 61, the N region 62, the N+ region 63, and the N++ region 64 are arranged in the stated order in the direction extending from the P+ region 53 to the end 52.

The potentials from the N− region 61 to the N++ region 64 are different from one another in depth as indicated by the arrow Q22. An area closer to the end 52 facing the readout gate 22 has a deeper potential.

It should be noted that the part indicated by the arrow Q22 in FIG. 2 shows the potentials of the respective regions when the photoelectric conversion unit 51 indicated by the arrow Q21 is seen from a lateral direction, that is, from the cross-sectional direction taken along the a-a' line. Specifically, a broken line L11 represents the potentials of the respective regions of the photoelectric conversion unit 51. In particular, the parts indicated by the arrow A11 to the arrow A15 represent the potentials of the P+ region 53 and the N− region 61 to the N++ region 64, respectively.

For example, the potential of the N− region 61 indicated by the arrow A12 is slightly deeper than the potential of the adjacent P+ region 53. The potential of the N region 62 indicated by the arrow A13 is deeper than the potential of the adjacent N− region 61.

Further, the potential of the N+ region 63 indicated by the arrow A14 is deeper than the potential of the adjacent N region 62. The potential of the N++ region 64 indicated by the arrow A15 is deeper than the potential of the adjacent N+ region 63.

Furthermore, the potentials of the N− region 61 to the N++ region 64 are substantially the same. More specifically, in each of the N− region 61 to the N++ region 64, a part closer to a boundary with another region adjacent on the readout gate 22 side has a deeper potential. Additionally, particularly in boundary portions between the regions from the N− region 61 to the N++ region 64, the depth of the potential steeply changes.

When a stepwise gradient is provided to the potentials of the respective regions of the photoelectric conversion unit 51 in such a manner, the charge accumulated in the photoelectric conversion unit 51 can be transferred to the horizontal shift register 23 via the readout gate 22 efficiently and more reliably.

Incidentally, as described above, due to the reduction of a voltage available for the imaging device 11, and the like, the potential of the whole photoelectric conversion unit 51 is gradually made shallow. Meanwhile, there is a growing need for increasing a potential gradient in the photoelectric conversion unit 51. For that reason, the difference between the potential of the P+ region 53 serving as the channel stop region and the potential of the N− region 61 being adjacent to the P+ region 53 tends to be small.

In such a case, due to variations at the time of production of the imaging device 11, the potential of the P+ region 53 and the potential of a region near the P+ region 53 in the N− region 61 are substantially the same, and a reduced sensitivity phenomenon occurs in the N-region 61. In particular, even in the case where the gradient of the potential (electric field) is not provided to the regions of the photoelectric conversion unit 51, the reduced sensitivity easily occurs in the region near the P+ region 53.

Figure 3:
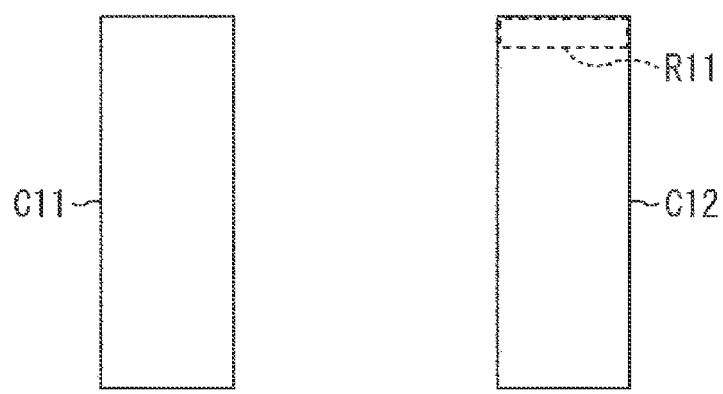
FIG. 3 is a diagram for describing the occurrence of a reduced sensitivity.

For example, as shown in FIG. 3, it is assumed that there are two types of pixels 21 forming the imaging device 11: a pixel including the photoelectric conversion unit 51 formed of only a photoelectric conversion region C11 that performs a normal operation (hereinafter, the pixel is also referred to as normal pixel); and a pixel including the photoelectric conversion unit 51 formed of a photoelectric conversion region C12 including a region R11 with reduced sensitivity (hereinafter, the pixel is also referred to as reduced-sensitivity pixel).

In the reduced-sensitivity pixel, a reduced sensitivity occurs in the region R11 at the end facing the P+ region 53. The region R11 is a channel region in the photoelectric conversion region C12.

As in this example, even when the size (area) of the region R11 in which the reduced sensitivity occurs is about 5% of the whole size of the photoelectric conversion region C12, there is a possibility that such an imaging device 11 is not used as a normal product depending on application programs using the imaging device 11. For example, when the imaging device 11 including the reduced-sensitivity pixel is used as an autofocusing sensor, there is a risk that the accuracy in autofocusing is deteriorated.

On the other hand, variations in output of the imaging device 11 are generated not only in the photoelectric conversion unit 51 but also in the charge detecting unit 24, a circuit at a subsequent stage, and the like. For that reason, in the standards of screening, errors of about ±30% from a reference value of a pixel signal of each pixel 21 is permissible in many cases. The pixel signal is the output signal of the imaging device 11. In such a case, however, it is difficult to detect that the imaging device 11 including the pixel 21 with reduced sensitivity is an abnormal product by screening using a measurement method in related art.

In this regard, the imaging device 11 to which an embodiment of the present disclosure is applied has the following configuration. Sufficient screening can be performed by using a measurement environment in related art even in the case where the area of the photoelectric conversion unit 51 is large but the imaging device 11 is used in an application program susceptible to the influence of the variations in pixel area due to the occurrence of the reduced sensitivity.

Figure 4:
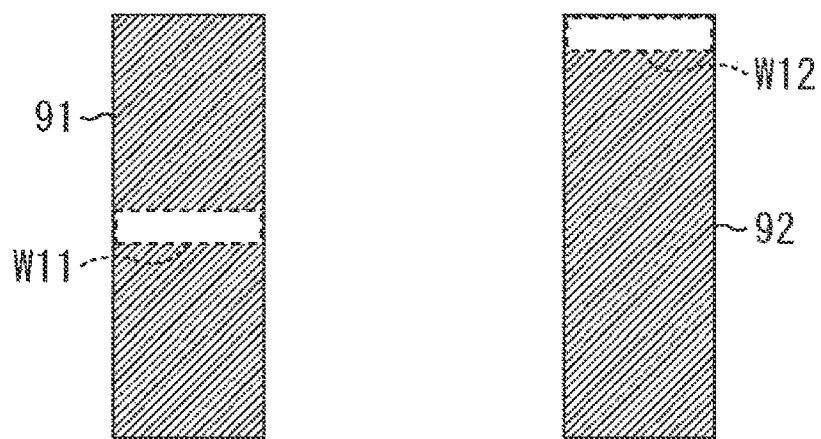
FIG. 4 is a diagram showing a configuration example of a light-shielding part.

Specifically, the imaging device 11 has a configuration shown in FIG. 4, in which the pixels 21 forming the imaging device 11 include a pixel 21 having a light-shielding part 91 and a pixel 21 having a light-shielding part 92. It should be noted that in each of the light-shielding part 91 and the light-shielding part 92 of FIG. 4, the upper end is an end of the pixel 21, the end facing the channel stop region, and the lower end is an end facing the readout gate 22.

In the light-shielding part 91, an opening W11 is provided at the center region of the light-shielding part 91. External light is input only from the opening W11 to the photoelectric conversion unit 51 of the pixel 21 to which the light-shielding part 91 is provided.

The opening W11 is provided at a position from which light is input to the center portion where a reduced sensitivity phenomenon is difficult to occur in the photoelectric conversion unit 51. Thus, in the pixel 21 provided with the light-shielding part 91, the region where the reduced sensitivity is easy to occur in the photoelectric conversion unit 51 is constantly in a light-shielded state. For that reason, the pixel 21 provided with the light-shielding part 91 is used as a reference pixel that outputs a reference output signal at the time of screening.

Further, in the light-shielding part 92, an opening W12 is provided at a region near the end facing the channel stop region. External light is input only from the opening W12 to the photoelectric conversion unit 51 of the pixel 21 to which the light-shielding part 92 is provided. Here, the opening W12 has the same area (size) and shape as the opening W11.

The opening W12 is provided at a position from which light is input to the region where the reduced sensitivity phenomenon is easily occur in the photoelectric conversion unit 51, the region being located near the end facing the channel stop region, that is, the region near the opposite end of the end from which the charge accumulated in the photoelectric conversion unit 51 is read out. For that reason, in the pixel 21 provided with the light-shielding part 92, a region other than the region where the reduced sensitivity is easy to occur in the photoelectric conversion unit 51 is constantly in a light-shielded state. External light is input to only the region where the reduced sensitivity is easy to occur in the photoelectric conversion unit 51.

In this regard, the pixel 21 provided with the light-shielding part 92 is used as a detection pixel. The detection pixel is a target for which whether the reduced sensitivity occurs or not is detected at the time of screening.

It should be noted that in the pixel 21 used as a reference pixel, the opening W11 is provided at the center portion of the light-shielding part 91. However, the opening W11 may be provided at any position as long as the position is a position from which light is input to the region where the reduced sensitivity phenomenon is difficult to occur in the photoelectric conversion unit 51.

At the time of screening of the imaging device 11, whether the imaging device 11 is an abnormal product or not is determined based on the output signal that is output from the reference pixel as the pixel 21 to which the light-shielding part 91 is provided and on the output signal that is output from the detection pixel as the pixel 21 to which the light-shielding part 92 is provided. In other words, whether the imaging device 11 is an abnormal product including a reduced-sensitivity pixel or a normal product including no reduced-sensitivity pixel is determined.

Here, it is assumed that the output signal of the pixel 21 serving as the reference pixel that is output from the imaging device 11 is VoutA, and the output signal of the pixel 21 serving as the detection pixel that is output from the imaging device 11 is VoutB.

In this case, the area of the opening W11 provided to the reference pixel and the area of the opening W12 provided to the detection pixel are equal. So, if the reduced sensitivity does not occur in the reference pixel and the detection pixel, the values of the output signal VoutA and the output signal VoutB are supposed to be substantially equal. In other words, the ratio of the output signals is supposed to be VoutB/VoutA≈1.

In contrast to this, when the reduced sensitivity occurs in the detection pixel, the value of the output signal VoutB becomes smaller than the value of the output signal VoutA of a normal pixel 21 due to the reduced sensitivity. Thus, the ratio of the output signals is supposed to be VoutB/VoutA<1.

Consequently, comparing such a ratio VoutB/VoutA of the output signals with a predetermined threshold value, it is possible to easily and highly accurately determine whether or not the imaging device 11 is an abnormal product, which includes a pixel 21 with reduced sensitivity having a permissible value or more.

For example, the following case is assumed. The pixel 21 has a reduced sensitivity region with reduced sensitivity of 50% of the normal case, and the reduced sensitivity region occupies an area corresponding to 5% of the entire area of the pixel 21, that is, the entire photoelectric conversion unit 51.

In such a case, in the imaging device having the configuration in related art, a reduced-sensitivity pixel can obtain an output corresponding to 97.5 (=100−5×0.5) % of the output of a normal pixel. For that reason, it is difficult to determine whether the reduction by 2.5% of the output signal of the reduced-sensitivity pixel is caused by the reduced sensitivity that has occurred in the pixel or caused by other factors.

Here, those other factors are assumed to be variations in gain in a circuit such as the charge detecting unit at a subsequent stage of the pixel, variations in film thickness of an upper layer film provided on the top of the photoelectric conversion unit of the pixel, variations in level of light collected by a lens that guides the light to the pixel, and the like.

In addition, in the screening in related art, the output signal of the pixel of an imaging device to be inspected is compared with the output signal of the pixel of an imaging device, which is different from the imaging device to be inspected and serves as a different chip assumed to be normal. Thus, the screening is susceptible to the influence of variations in other measurements. For that reason, it is practically difficult to sort a normal product from an abnormal product.

In contrast to this, in the imaging device 11, even when the reduced sensitivity region with reduced sensitivity of 50% occupies an area corresponding to 5% of the entire area, the ratio of the output signals is VoutB/VoutA=0.5. Thus, it is possible to distinguish the normal product from the abnormal product highly accurately.

Specifically, for example, when a threshold value th is set to 0.9 and the ratio VoutB/VoutA of the output signals is equal to the threshold value th of 0.9 or smaller, the imaging device 11 to be inspected is determined to be an abnormal product. It should be noted that the threshold value th may be any other value, for example, 0.5. In particular, for example, when the threshold value th is set to about 0.5, the normal product and the abnormal product can be distinguished from each other. When the threshold value th is set to 0.9, only a normal product can be extracted more reliably.

It should be noted that the reference pixel and the detection pixel are different from each other in the position of the opening and thus different from each other in the potential of the region where light is input from the opening of the photoelectric conversion unit 51.

The difference in output signal that is caused due to such a difference in potential is slighter than the difference in output signal that is caused due to the reduced sensitivity. So, the difference in position of the opening does not influence the measurement of the sensitivity characteristics of the imaging device 11.

As described above, according to the imaging device 11, the two pixels 21 that are equal in the area of the opening but different in the position of the opening are provided, and the ratio of the output signals of those pixels 21 is compared with the predetermined threshold value th, for example. This allows an abnormal product to be screened highly accurately. In other words, this allows characteristics such as the sensitivity in the photoelectric conversion unit 51 of the imaging device 11 to be measured more highly accurately.

Further, even when the reduced sensitivity occurs in the pixel 21 serving as a reference pixel, since the opening W11 of the reference pixel is provided at the center region of the pixel 21 at which the reduced sensitivity is difficult to occur, the output signal VoutA of the reference pixel has substantially the same value irrespective of whether or not the reduced sensitivity occurs in the pixel 21. Furthermore, the opening W12 of the detection pixel is provided near the end of the pixel 21 at which the reduced sensitivity is easy to occur. Consequently, even when the reference pixel and the detection pixel are provided on the same chip, that is, on one imaging device 11, the characteristics of the pixel 21 can be measured highly accurately.

If the reference pixel and the detection pixel are provided on the same chip, a measurement error due to the influence by variations in gain of a subsequent-stage circuit of the pixel 21 and the like can be suppressed to the minimum, and thus the screening accuracy can be more improved.

Further, the two pixels 21 that are different from each other in the position of the opening (light-shielding position) are provided to the imaging device 11, and the measurement of the output signals of those pixels 21 is added to a screening technique in related art. Only such a procedure can provide a screening technique to which an embodiment of the present disclosure is applied. Furthermore, in the present disclosure, light-shielding pixels that are not used for production use only have to be used as a reference pixel and a detection pixel, and only with the openings provided to the light-shielding pixels, the reference pixel and the detection pixel can be provided. Consequently, it is unnecessary to increase a chip area or add a process at the time of manufacture and inspection of the imaging device 11.

In addition, in this example, the measurement corresponding to two pixels only have to be added. So, an increase in measurement time is slight, and thus such a measurement can be adopted almost without generating additional costs.

It should be noted that the pixel 21 serving as the reference pixel provided with the light-shielding part 91 and the pixel 21 serving as the detection pixel provided with the light-shielding part 92 are provided in, for example, an area outside an effective pixel region formed of pixels used for imaging of a subject. An ineffective pixel region being a region outside the effective pixel region is, for example, an optical black region (light-shielding pixel region) that is not used for imaging. The ineffective pixel region is located near the end on a light-receiving surface, that is, an edge portion or the like, of the imaging device 11.

In addition, in order to reduce the measurement error of the characteristics of the imaging device 11 more, it may be possible to use two pixels 21, which have a common circuit as a subsequent-stage circuit, for a reference pixel and a detection pixel or to use two pixels 21, which are connected to a common horizontal shift register 23, for a reference pixel and a detection pixel. If the reference pixel and the detection pixel are connected to a common subsequent-stage circuit, an error is not caused in the common circuit when the output signals of those pixels are read out. This allows sensitivity characteristics to be measured more highly accurately.

Configuration Example of Inspection System

Figure 5:
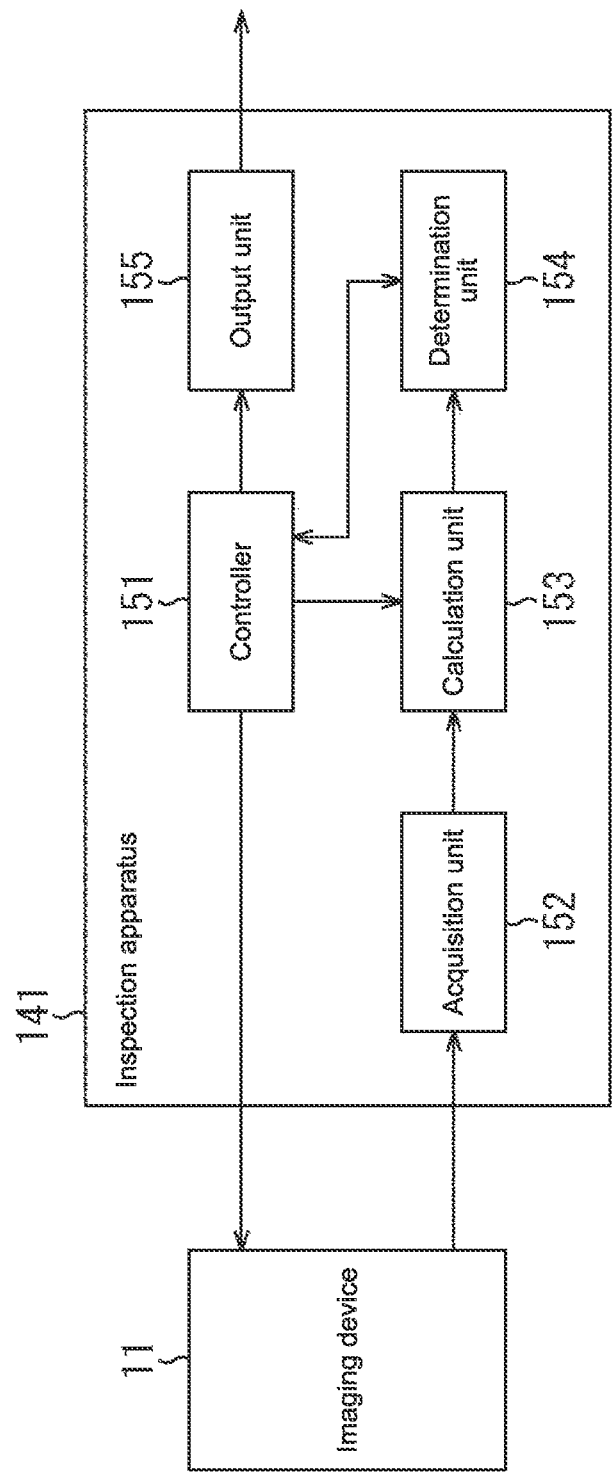
FIG. 5 is a diagram showing a configuration example of an inspection system.

Subsequently, the following inspection system will be described. In the inspection system, screening on whether the imaging device 11 described above is a normal product or not is performed. For example, the inspection system has a configuration as shown in FIG. 5. It should be noted that in FIG. 5, parts corresponding to those in FIG. 1 are denoted by the same reference numerals as those in FIG. 1, and description thereof will be appropriately omitted.

The inspection system shown in FIG. 5 includes the imaging device 11 and an inspection apparatus 141.

The inspection apparatus 141 controls the imaging device 11 to capture an image of light input from the outside, or acquires the output signal of each pixel 21 obtained through the imaging and measures characteristics of the imaging device 11, to inspect the imaging device 11.

The inspection apparatus 141 includes a controller 151, an acquisition unit 152, a calculation unit 153, a determination unit 154, and an output unit 155.

The controller 151 controls the whole operation of the inspection apparatus 141. For example, the controller 151 controls the calculation unit 153 to execute a calculation based on the output signal acquired from the imaging device 11, or controls the determination unit 154 to execute a determination based on the result of the calculation by the calculation unit 153. Further, the controller 151 controls the output unit 155 to output the result of the determination by the determination unit 154 or controls the drive of the imaging device 11.

The acquisition unit 152 acquires the output signals of the respective pixels 21 from the imaging device 11 and supplies the output signals to the calculation unit 153. In particular, the acquisition unit 152 acquires the output signals of the reference pixel and the detection pixel, which serve as pixels used for measuring characteristics of the imaging device 11, that is, pixels used for measuring sensitivity characteristics of the imaging device 11.

The calculation unit 153 executes a calculation of obtaining a value indicating the characteristics of the imaging device 11 based on the output signals supplied from the acquisition unit 152, measures the characteristics of the imaging device 11, and supplies the calculation result thus obtained to the determination unit 154. For example, the ratio of the output signals of the reference pixel and the detection pixel, those pixels indicating the sensitivity characteristics of the pixels 21, is calculated as a value indicating the characteristics of the imaging device 11, and thus the sensitivity characteristics of the imaging device 11 are measured.

The determination unit 154 determines whether the imaging device 11 is a normal product or not, based on the result of the computation, which has been supplied from the calculation unit 153, and supplies the result of the determination to the controller 151. The output unit 155 outputs the result of the determination on whether the imaging device 11 is a normal product or not, to the outside, the result of the determination having been supplied from the controller 151.

(Description on Inspection Processing)

Figure 6:
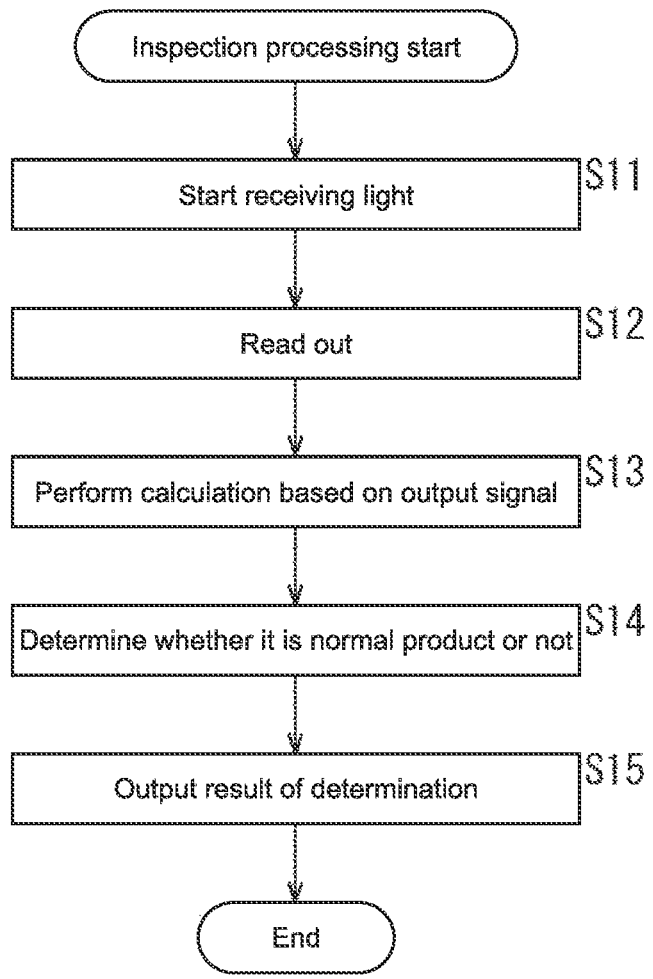
FIG. 6 is a flowchart for describing inspection processing.

Next, inspection processing by the inspection apparatus 141 will be described with reference to the flowchart of FIG. 6. For example, the inspection processing is performed for each chip in which part or the whole of the imaging device 11 is formed.

In Step S11, the controller 151 controls the imaging device 11 to start receiving light from the outside. Under the control of the controller 151, the imaging device 11 turns on a reset gate of each pixel 21 to reset the photoelectric conversion unit 51 of the pixel 21, and starts receiving the light input from the outside. In other words, the photoelectric conversion unit 51 receives the light input from the outside, performs photoelectric conversion on the received light, and accumulates the charge obtained as a result of the photoelectric conversion.

In Step S12, the controller 151 controls the imaging device 11 to read out the charge accumulated in the pixels 21. Under the control of the controller 151, the imaging device 11 turns on the readout gate 22.

Through this processing, the readout gate 22 reads out the charge accumulated in the photoelectric conversion unit 51 of each pixel 21 and outputs the charge to the horizontal shift register 23. The horizontal shift register 23 transfers the charge of each pixel 21, which has been supplied from the readout gate 22, to the charge detecting unit 24. Further, the charge detecting unit 24 generates the output signal of each pixel 21 based on the charge supplied from the horizontal shift register 23, and outputs the generated output signal.

The acquisition unit 152 of the inspection apparatus 141 acquires the output signal of each pixel 21, which has been output from the imaging device 11, and supplies the output signal to the calculation unit 153.

In Step S13, the calculation unit 153 performs a calculation based on the output signals supplied from the acquisition unit 152 and supplies the result of the calculation to the determination unit 154.

For example, the calculation unit 153 calculates the ratio VoutB/VoutA of the output signal VoutA of a pixel 21 serving as the reference pixel provided with the light-shielding part 91, and of the output signal VoutB of a pixel 21 serving as the detection pixel provided with the light-shielding part 92, among the pixels 21 of the imaging device 11. Subsequently, the calculation unit 153 supplies the result of the calculation to the determination unit 154.

In Step S14, the determination unit 154 performs a determination on whether the imaging device 11 to be inspected is a normal product or not, based on the result of the calculation, which has been supplied from the calculation unit 153. The determination unit 154 supplies the result of the determination to the output unit 155 via the controller 151.

For example, the determination unit 154 compares the ratio VoutB/VoutA of the output signals supplied from the calculation unit 153 with a predetermined threshold value th. In the case where the value of the ratio VoutB/VoutA is the threshold value th or smaller, the determination unit 154 determines that the imaging device 11 is an abnormal product. In other words, it is considered that the reduced sensitivity of a permissible value or larger occurs in the detection pixel of the imaging device 11.

In the case where the value of the ratio VoutB/VoutA is larger than the threshold value th, the determination unit 154 determines that the imaging device 11 to be inspected is a normal product.

In Step S15, the output unit 155 outputs the result of the determination, which has been supplied from the determination unit 154 via the controller 151, and the inspection processing is terminated. For example, the output unit 155 supplies the result of the determination on whether the imaging device 11 is a normal product or not to a display apparatus connected to the inspection apparatus 141 and causes the display apparatus to display the result of the determination.

As described above, the inspection apparatus 141 controls the imaging device 11 to perform imaging processing and determines whether the imaging device 11 is a normal product or not, based on the output signals of the pixels 21 serving as the reference pixel and the detection pixel, the output signals being output from the imaging device 11. In such a manner, the determination on whether the imaging device 11 is a normal product or not is performed based on the output signals of the pixels 21 serving as the reference pixel and the detection pixel, and thus whether the imaging device 11 to be inspected is a normal product or not can be highly accurately determined. In other words, the characteristics of the pixels 21 of the imaging device 11 can be highly accurately measured.

In the above description, the case where the determination on whether the imaging device 11 formed as one chip is a normal product or not is performed has been described. However, the inspection processing may be performed on one wafer on which a plurality of chips of the imaging devices 11 are provided or performed for each lot including a plurality of wafers manufactured under the same conditions.

In such a case, for example, when an output signal is read out from one chip (imaging device 11) of one wafer to perform determination processing and the imaging device 11 is determined to be a normal product, it is considered that all imaging devices 11 on the wafer on which the above-mentioned chip (imaging device 11) is formed are normal products. As in the above case, for example, when an output signal is read out from one chip (imaging device 11) of one wafer to perform determination processing and the imaging device 11 is determined to be a normal product, it is considered that all the imaging devices 11 of wafers belonging to a lot including the wafer on which the chip is formed are normal products.

Modified Example 1 of First Embodiment

Configuration Example of Imaging Device

Further, hereinabove, the case where the two pixels 21 provided to the imaging device 11 are used as the reference pixel and the detection pixel and the output signals of those pixels 21 are compared with each other has been described, but a plurality of combinations of the reference pixel and the detection pixel may be provided in wafer surface or in chip surface.

Figure 7:
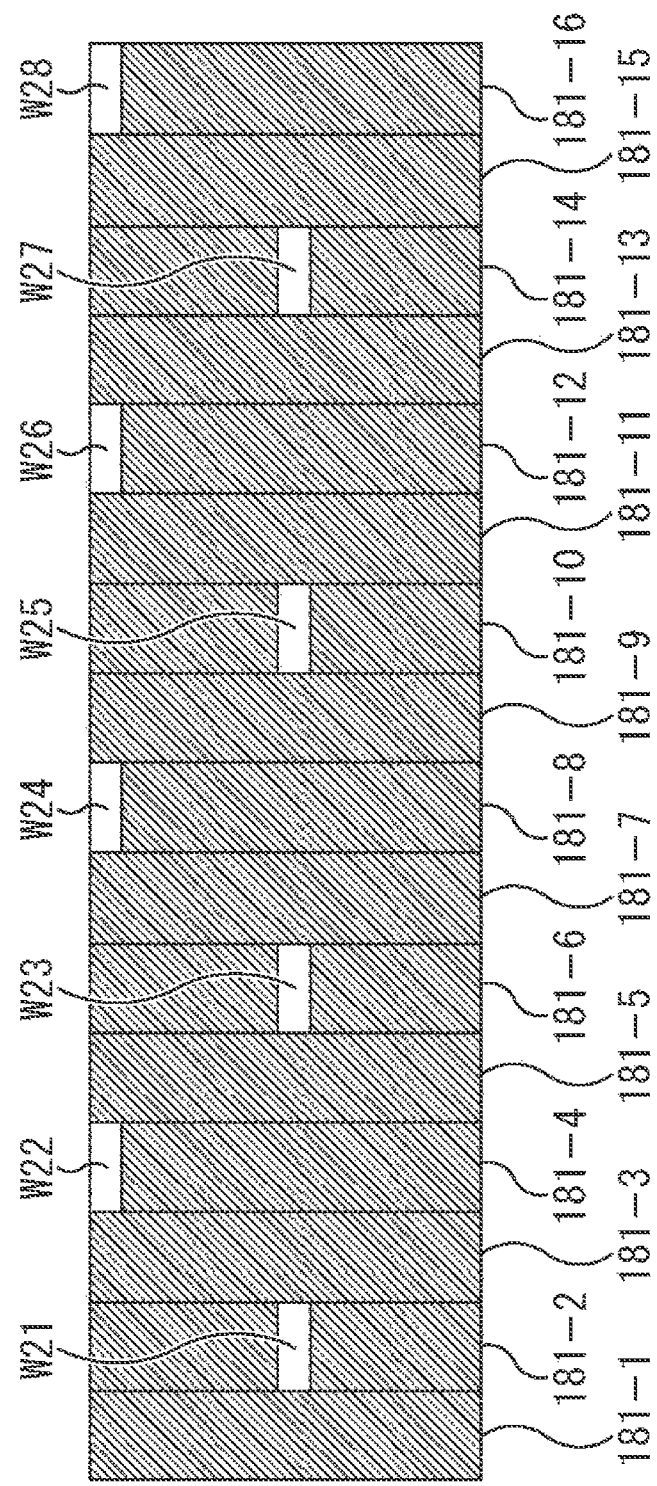
FIG. 7 is a diagram showing another arrangement example of an opening.

In such a case, as shown in FIG. 7 for example, some of pixels 181-1 to 181-16 disposed in the same pixel row are used as the reference pixel and the detection pixel.

It should be noted that hereinafter the pixels 181-1 to 181-16 are also simply referred to as pixels 181, unless the pixels 181-1 to 181-16 have to be distinguished from one another. Here, the pixels 181 shown in FIG. 7 are pixels provided in a part of a region including pixels forming the imaging device, specifically, pixels provided in the ineffective pixel region.

Those pixels 181 are pixels corresponding to the pixels 21 of the imaging device 11 shown in FIG. 1. In FIG. 7, upper ends of the pixels 181 are ends facing the channel stop region, and lower ends of the pixels 181 are ends facing the readout gate that reads out the charge accumulated in the pixels 181.

In this example, the light-shielding part is provided to a front surface of each pixel 181 in FIG. 7.

Further, at the center of the light-shielding parts of the pixels 181-2, 181-6, 181-10, and 181-14, rectangular openings W21, W23, W25, and W27 are provided, respectively.

Those openings W21, W23, W25, and W27 are provided at positions from which light is input to the center portions where the reduced sensitivity phenomenon is difficult to occur in the photoelectric conversion units.

For that reason, the pixels 181-2, 181-6, 181-10, and 181-14 are used as reference pixels.

Further, rectangular openings W22, W24, W26, and W28 are provided to the ends of the light-shielding parts of the pixels 181-4, 181-8, 181-12, and 181-16, respectively, the ends facing the channel stop region.

Those openings W22, W24, W26, and W28 are provided at positions from which light is input to end portions where the reduced sensitivity phenomenon is easy to occur in the photoelectric conversion units. For that reason, the pixels 181-4, 181-8, 181-12, and 181-16 are used as detection pixels.

It should be noted that the openings W21 to W28 have the same area.

In the imaging device provided with the pixels 181 shown in FIG. 7, at the time of screening, for example, the following pairs of a reference pixel and a detection pixel are created: the pixel 181-2 and the pixel 181-4; the pixel 181-6 and the pixel 181-8; the pixel 181-10 and the pixel 181-12; and the pixel 181-14 and the pixel 181-16.

For example, in Step S13 of the inspection processing described with reference to FIG. 6, the ratio VoutB/VoutA of the output signals is calculated for each pair. In Step S14, in the case where one value of the ratio VoutB/VoutA is the threshold value th or smaller among the values of the ratio VoutB/VoutA, it is determined that the imaging device is an abnormal product.

In such a way, the plurality of pairs of the reference pixel and the detection pixel are used for screening, and thus the detection accuracy of the abnormal product can be improved.

In the case where the reduced sensitivity occurs in the pixels 181 and variations in sensitivity are small, the imaging device may be determined as a normal product in some cases. In such a case, whether the imaging device 11 is a normal product or not may be determined in accordance with, for example, the difference in the ratio VoutB/VoutA of the output signals, the ratio being calculated for each pair.

Further, in FIG. 7, the example in which the positions of the openings provided to the respective reference pixels or detection pixels are the same have been described. However, the positions of the openings provided to the respective reference pixels may be different from one another, or the positions of the openings provided to the respective detection pixels may be different from one another. Providing the openings at different positions for the respective pixels allows the signs of characteristics variations of the photoelectric conversion units to be easily found.

Modified Example 2 of First Embodiment

Configuration Example of Imaging Device

Figure 8:
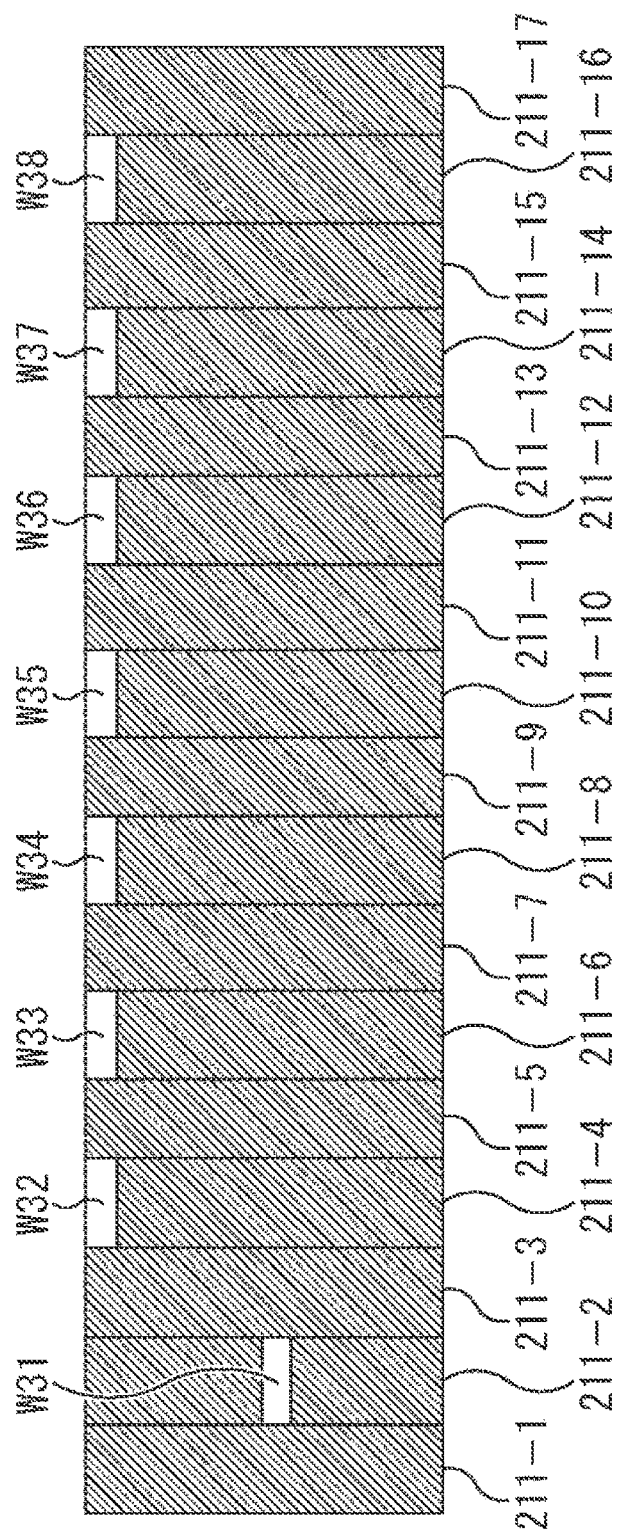
FIG. 8 is a diagram showing another arrangement example of the opening.

Further, as shown in FIG. 8 for example, one of pixels 211-1 to 211-17 disposed in the same pixel row may be used as a reference pixel, and a plurality of detection pixels may be provided for one reference pixel.

It should be noted that hereinafter the pixels 211-1 to 211-17 are also simply referred to as pixels 211, unless the pixels 211-1 to 211-17 have to be distinguished from one another. Here, the pixels 211 are pixels provided in a part of a region including pixels forming the imaging device, specifically, pixels provided in the ineffective pixel region.

Those pixels 211 are pixels corresponding to the pixels 21 of the imaging device 11 shown in FIG. 1. In FIG. 8, upper ends of the pixels 211 are ends facing the channel stop region, and lower ends of the pixels 211 are ends facing the readout gate that reads out the charge accumulated in the pixels 211.

In this example, the light-shielding part is provided to a front surface of each pixel 211 in FIG. 8.

Further, at the center of the light-shielding part of the pixel 211-2, a rectangular opening W31 is provided. The opening W31 is provided at a position from which light is input to the center portion where the reduced sensitivity phenomenon is difficult to occur in the photoelectric conversion unit. The pixel 211-2 is used as a reference pixel.

Further, rectangular openings W32 to W38 are provided to the ends of the light-shielding parts of the pixels 211-4, 211-6, 211-8, 211-10, 211-12, 211-14, and 211-16, respectively, the ends facing the channel stop region.

Those openings W32 to W38 are provided at positions from which light is input to end portions where the reduced sensitivity phenomenon is easy to occur in the photoelectric conversion units. For that reason, the pixels 211-4, 211-6, 211-8, 211-10, 211-12, 211-14, and 211-16 are used as detection pixels.

It should be noted that the openings W31 to W38 have the same area, and the openings W32 to W38 are provided at the same positions in the pixels 211.

In the imaging device provided with the pixels 211 shown in FIG. 8, at the time of screening, for example, the following pairs of a reference pixel and a detection pixel are created: the pixel 211-2 and the pixel 211-4; the pixel 211-2 and the pixel 211-6; the pixel 211-2 and the pixel 211-8; the pixel 211-2 and the pixel 211-10; the pixel 211-2 and the pixel 211-12; the pixel 211-2 and the pixel 211-14; and the pixel 211-2 and the pixel 211-16. Subsequently, for example, in Step S13 of the inspection processing described with reference to FIG. 6, the ratio VoutB/VoutA of the output signals is calculated for each pair. In Step S14, in the case where one value of the ratio VoutB/VoutA is a threshold value th or smaller among the values of the ratio VoutB/VoutA, it is determined that the imaging device is an abnormal product.

In the example of FIG. 8, the reference pixel and the plurality of detection pixels are provided in the same pixel row. The pixels disposed in the same pixel row are connected to a common circuit serving as a subsequent-stage circuit of the pixels in many cases. When the reference pixel and the plurality of detection pixels have a common circuit at a subsequent stage, characteristics such as the sensitivity in the photoelectric conversion units can be more highly accurately measured.

Additionally, also in the case of FIG. 8, in the case where variations in the ratio VoutB/VoutA of the output signals calculated for the respective pairs are small as in the case of FIG. 7, it may be determined that the imaging device is a normal product, depending on the intended use of the imaging device.

Modified Example 3 of First Embodiment

Configuration Example of Light-Shielding Part

Further, depending on the application program, the imaging device may have defects when variations in sensitivity for each pixel or the reduced sensitivity in a specific region are caused, though the occurrence of the reduced sensitivity region is permissible. In this regard, for the imaging device 11 used in such an application program, when the shape of the opening provided to the light-shielding part is variously devised as shown in FIG. 9 for example, characteristics such as the sensitivity in the photoelectric conversion unit 51 of the imaging device 11 can be more highly accurately measured.

Figure 9:
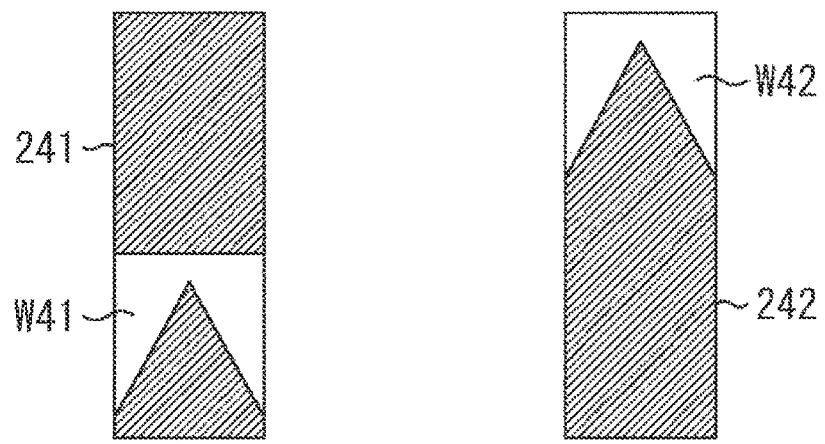
FIG. 9 is a diagram showing another configuration example of the light-shielding part.

For example, the imaging device 11 has a configuration shown in FIG. 9, in which the pixels 21 forming the imaging device 11 include a pixel 21 having a light-shielding part 241 and a pixel 21 having a light-shielding part 242. It should be noted that in each of the light-shielding part 241 and the light-shielding part 242 of FIG. 9, the upper end is an end of the pixel 21, the end facing the channel stop region, and the lower end is an end facing the readout gate 22.

In the light-shielding part 241, an opening W41 is provided at a slightly lower region than the center of the light-shielding part 241. External light is input only from the opening W41 to the photoelectric conversion unit 51 of the pixel 21 to which the light-shielding part 241 is provided.

The opening W41 is provided at a position from which light is input to a portion where the reduced sensitivity phenomenon is difficult to occur in the photoelectric conversion unit 51. Thus, the pixel 21 provided with the light-shielding part 241 is used as a reference pixel.

Further, in the light-shielding part 242, an opening W42 having the same shape as the N− region 61 is provided at the same region as the N− region 61 facing the channel stop region. So, in the photoelectric conversion unit 51 of the pixel 21 to which the light-shielding part 242 is provided, external light is input from the opening W42 to only the N− region 61, and the pixel 21 to which the light-shielding part 242 is provided is used as a detection pixel. Here, the opening W42 has the same shape and area as the opening W41.

As described above, the pixel 21 to which the light-shielding part 241 is provided is used as a reference pixel, and the pixel 21 to which the light-shielding part 242 is provided is used as a detection pixel, and thus whether the reduced sensitivity in the N− region 61 occurs or not can be detected. In particular, as shown in FIG. 7 or 8, when the plurality of detection pixels are used to perform screening, the variations in sensitivity of the N− region 61 can be detected highly accurately, and whether the imaging device 11 is a detective product (abnormal product) or not can be determined more reliably.

Modified Example 4 of First Embodiment

Configuration Example of Light-Shielding Part

Further, in the case where the potential of each region of the photoelectric conversion unit 51 of the pixel 21 is provided with a gradient, the sensitivity is easy to vary in a region near the end of the photoelectric conversion unit 51, the end facing the channel stop region, particularly, a region where the potential steeply changes. For example, in the example of FIG. 2, particularly in a boundary portion between the N− region 61 and the N region 62, the sensitivity is easy to vary.

Figure 10:
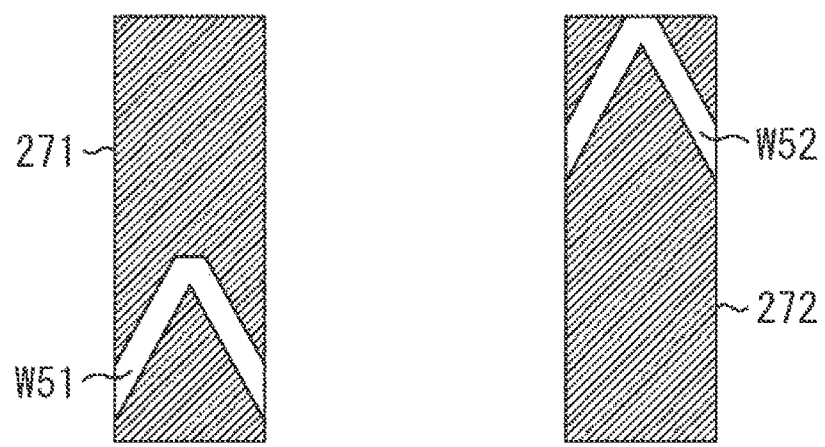
FIG. 10 is a diagram showing another configuration example of the light-shielding part.

In this regard, when the shape of the opening provided in the light-shielding part is variously devised as shown in FIG. 10 for example, the reduced sensitivity and the variations in sensitivity in a specific region of the photoelectric conversion unit 51 can be more highly accurately detected.

In the example of FIG. 10, the imaging device 11 has a configuration shown in FIG. 10, in which the pixels 21 forming the imaging device 11 include a pixel 21 having a light-shielding part 271 and a pixel 21 having a light-shielding part 272. It should be noted that in each of the light-shielding part 271 and the light-shielding part 272 of FIG. 10, the upper end is an end of the pixel 21, the end facing the channel stop region, and the lower end is an end facing the readout gate 22.

In the light-shielding part 271, an opening W51 is provided at a slightly lower region than the center of the light-shielding part 271. External light is input only from the opening W51 to the photoelectric conversion unit 51 of the pixel 21 to which the light-shielding part 271 is provided.

The opening W51 is provided at a position from which light is input to a portion where the reduced sensitivity phenomenon is difficult to occur in the photoelectric conversion unit 51. Thus, the pixel 21 provided with the light-shielding part 271 is used as a reference pixel.

Further, in the light-shielding part 272, an opening W52 is provided at a region of a boundary portion between the N region 62 and the N− region 61 facing the channel stop region. The opening W52 has substantially the same shape as that boundary. So, in the photoelectric conversion unit 51 of the pixel 21 to which the light-shielding part 272 is provided, external light is input from the opening W52 to only a region near the boundary between the N− region 61 and the N region 62, and the pixel 21 to which the light-shielding part 272 is provided is used as a detection pixel. Here, the opening W52 has the same shape and area as the opening W51.

As described above, the pixel 21 to which the light-shielding part 271 is provided is used as a reference pixel, and the pixel 21 to which the light-shielding part 272 is provided is used as a detection pixel, and thus whether the reduced sensitivity in the boundary portion between the N− region 61 and the N region 62 occurs or not can be detected. In particular, as shown in FIGS. 7 and 8, when the plurality of detection pixels are used to perform screening, the variations in sensitivity of the boundary portion between the N− region 61 and the N region 62 can be detected highly accurately, and whether the imaging device 11 is a detective product (abnormal product) or not can be determined more reliably.

Modified Example 5 of First Embodiment

Configuration Example of Imaging Device

Figure 11:
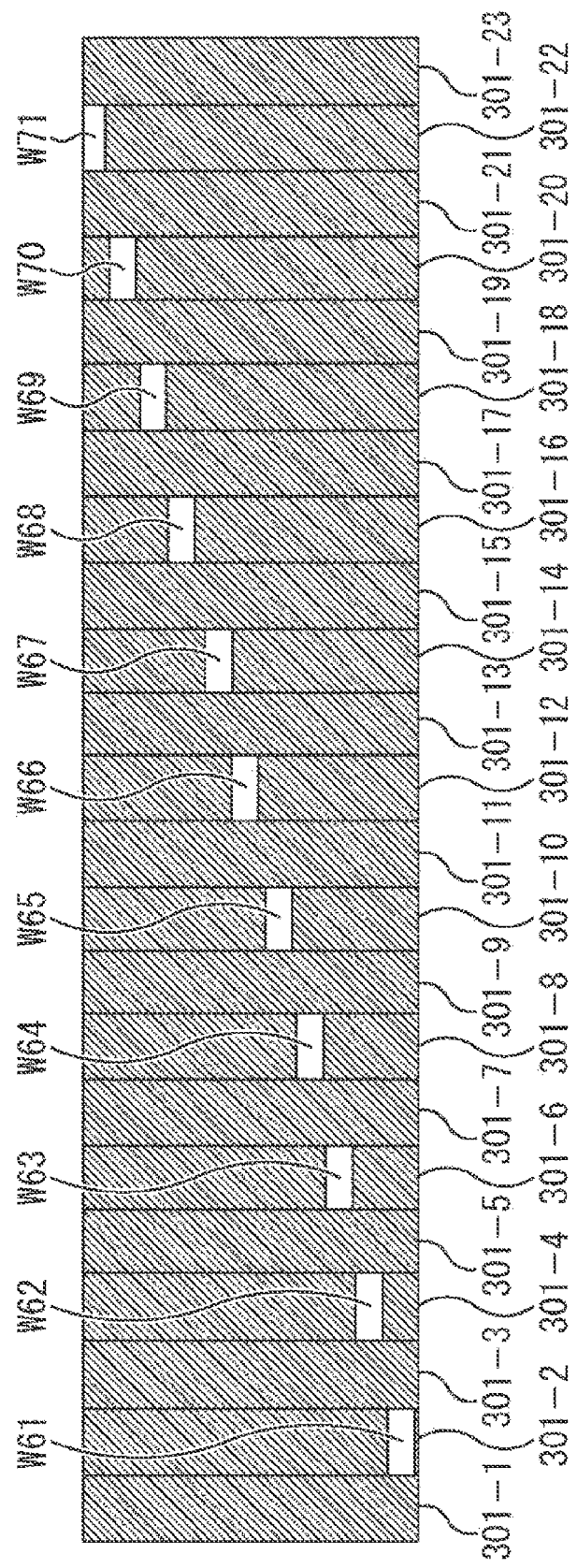
FIG. 11 is a diagram showing another arrangement example of the opening.

Further, the openings provided to the respective pixels are disposed with the positions of the openings being displaced by little and little as shown in FIG. 11 for example. Thus, an investigation on a position where the reduced sensitivity starts to occur, an investigation on spectral variations in a pixel, the investigation being combined with a spectrometric measurement, and other investigations can be performed.

In FIG. 11, openings are provided to some of pixels 301-1 to 301-23 disposed in the same pixel row. It should be noted that hereinafter the pixels 301-1 to 301-23 are also simply referred to as pixels 301, unless the pixels 301-1 to 301-23 have to be distinguished from one another. Here, the pixels 301 are pixels provided in a part of a region including pixels forming the imaging device, specifically, pixels provided in the ineffective pixel region.

Those pixels 301 are pixels corresponding to the pixels 21 of the imaging device 11 shown in FIG. 1. In FIG. 11, upper ends of the pixels 301 are ends facing the channel stop region, and lower ends of the pixels 301 are ends facing the readout gate that reads out the charge accumulated in the pixels 301.

In this example, the light-shielding part is provided to a front surface of each pixel 301 in FIG. 11.

Further, openings W61 to W71 are provided in the light-shielding parts of the pixels 301-2, 301-4, 301-6, 301-8, 301-10, 301-12, 301-14, 301-16, 301-18, 301-20, and 301-22, respectively.

The openings W61 to W71 are provided at different positions of the respective light-shielding parts. The openings W61 to W71 have the same shape and area. Consequently, comparing the output signals output from the pixels 301 to which those openings are provided, the characteristics of the photoelectric conversion units can be measured more highly accurately.

For example, it is assumed that the inspection apparatus 141 shown in FIG. 5 is connected to the imaging device including the pixels 301. In such a case, when the output signals of the pixels 301 are compared with one another in the calculation unit 153, the pixels 301 being provided with the openings W61 to W71, a region where the reduced sensitivity occurs among regions of the pixels 301 from the ends facing the channel stop region to the ends facing the readout gate can be identified.

Further, in the case where light in a specific wavelength is caused to be input to the pixels 301 with the wavelength being changed, when the output signals are compared with one another in the calculation unit 153, variations in sensitivity for each wavelength of the incident light in each of the regions of the photoelectric conversion units corresponding to the openings W61 to W71 can also be identified. In other words, the spectral characteristics of the photoelectric conversion units can be obtained.

Furthermore, optimal positions of the openings for the reference pixel and the detection pixel can be determined based on the result of the identification of the variations in sensitivity for each wavelength of the incident light in each photoelectric conversion unit of the pixel 301, the result of the identification of the region where the reduced sensitivity occurs, and the like. For example, a region with the smallest variations in sensitivity and the smallest reduced sensitivity may be set as a region of the opening W11 shown in FIG. 4, and a region where the variations in sensitivity and the reduced sensitivity are easy to occur may be set as a region of the opening W12 shown in FIG. 4.

In addition, for the output signals from the pixels 301 having the respective openings at different positions, for example, a reading time of each output signal in the acquisition unit 152, that is, a transfer time to the readout of the charge accumulated in the photoelectric conversion unit by the readout gate can also be measured. In this case, whether the charge can be read out within a predetermined time or not, and the like can be investigated.

Second Embodiment

Configuration Example of Imaging Device

Hereinabove, the case where the present disclosure is applied to the imaging device 11 such as a CCD linear sensor has been described, but the present disclosure is also applicable to an imaging device 331 such as a CCD image sensor serving as an area sensor shown in FIG. 12, for example.

Figure 12:
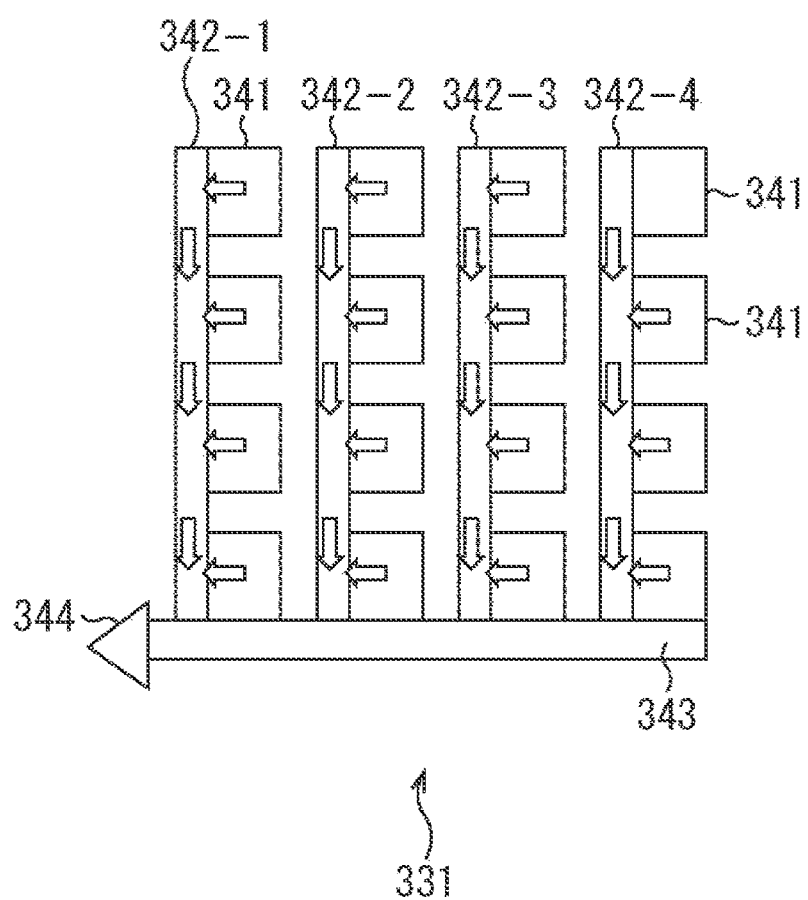
FIG. 12 is a diagram showing a configuration example of an imaging device.

The imaging device 331 shown in FIG. 12 includes pixels 341, charge transfer units 342-1 to 342-4, a charge transfer unit 343, and a charge detecting unit 344.

In the imaging device 331, the plurality of pixels 341 are arranged in a longitudinal direction and a lateral direction in FIG. 12. Each of the pixels 341 includes a photoelectric conversion unit corresponding to the photoelectric conversion unit 51 shown in FIG. 2, performs photoelectric conversion on light that is input from the outside, and accumulates obtained electrons (charge) therein. It should be noted that in FIG. 12, one square expresses one pixel 341. In this example, only some of the plurality of pixels 341 are denoted by reference numerals.

The pixels 341 arranged in the longitudinal direction in FIG. 12 are connected to the charge transfer units 342-1 to 342-4. It should be noted that hereinafter the charge transfer units 342-1 to 342-4 are also simply referred to as charge transfer units 342, unless the charge transfer units 342-1 to 342-4 have to be distinguished from one another.

The charge transfer units 342 transfer the charge (electrons), which have been transferred from the connected pixels 341, to the charge transfer unit 343 in the longitudinal direction (vertical direction) shown in FIG. 12. Further, the charge transfer units 342-1 to 342-4 are connected to the charge transfer unit 343. The charge transfer unit 343 transfers the charge having been transferred from the charge transfer units 342 to the charge detecting unit 344 in the lateral direction (horizontal direction) in FIG. 12.

The charge detecting unit 344 detects the amount of the charge transferred from each pixel 341 through the charge transfer unit 343 and outputs an electric signal corresponding to the amount of the charge as an output signal of each pixel 341.

Also in the imaging device 331 configured as shown in FIG. 12, when the light-shielding part 91 and the light-shielding part 92 shown in, for example, FIG. 4 are provided to the pixels 341 provided in a certain region such as an ineffective pixel region, the characteristics of the photoelectric conversion units can be measured highly accurately as in the case of the imaging device 11.

In particular, when a pixel 341 to be provided with the light-shielding part 91 and a pixel 341 to be provided with the light-shielding part 92 are connected to a single charge transfer unit 342, a common charge transfer path and a common subsequent-stage circuit can be used, and thus measurement accuracy of the characteristics of the photoelectric conversion units can be improved.

In this example, the left end of the pixel 341 of FIG. 12 is an end to which the charge is transferred, that is, an end corresponding to the end facing the readout gate 22 in the imaging device 11, and the right end of the pixel 341 of FIG. 12 is an end corresponding to the end facing the channel stop region in the imaging device 11. Further, also in the pixel 341, a potential gradient may be provided to the photoelectric conversion unit.

Third Embodiment

Configuration Example of Imaging Device

Further, the present disclosure may be applied to a CMOS (Complementary Metal Oxide Semiconductor) image sensor serving as an area sensor. In such a case, the imaging device serving as a CMOS image sensor is configured as shown in FIG. 13, for example.

Figure 13:
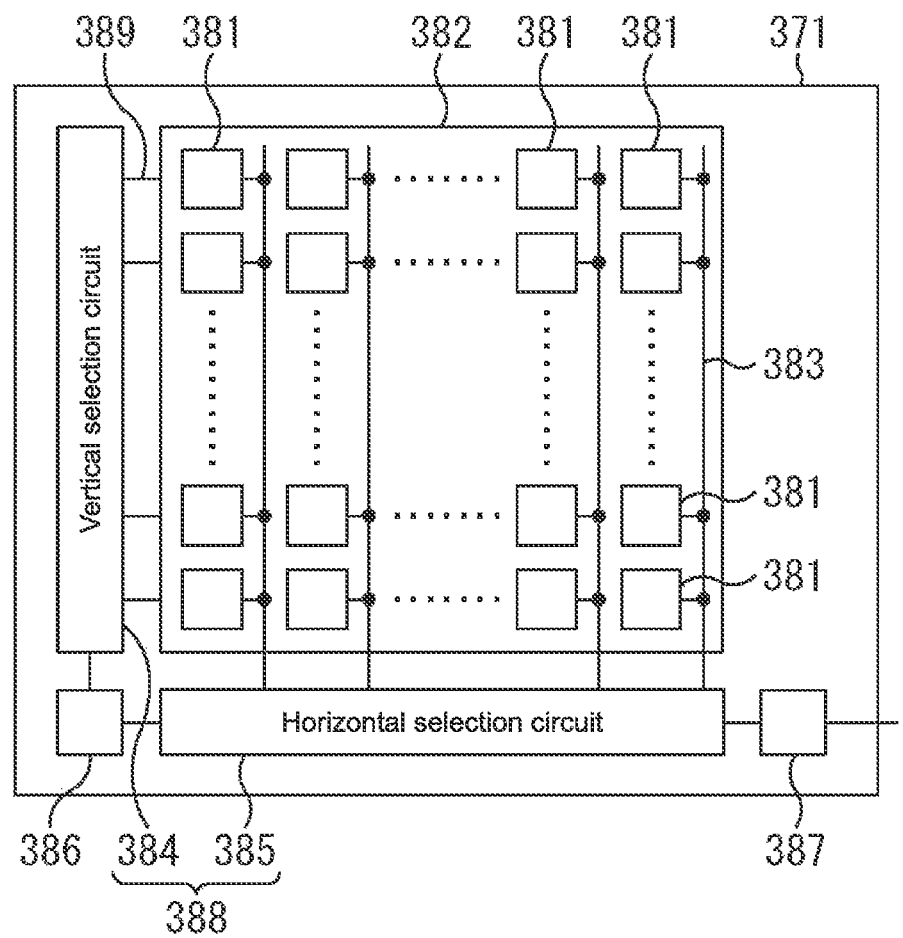
FIG. 13 is a diagram showing a configuration example of an imaging device.

An imaging device 371 shown in FIG. 13 includes a pixel array unit 382 in which a plurality of pixels 381 are arranged in a matrix, vertical signal lines 383, a vertical selection circuit 384, a horizontal selection circuit 385, a scanning controller 386, and an output circuit 387. It should be noted that hereinafter the vertical selection circuit 384 and the horizontal selection circuit 385 are also collectively referred to as a scanning unit 388.

The pixel array unit 382 includes the plurality of pixels 381 arranged in a matrix on a semiconductor substrate. It should be noted that in FIG. 13, some of the plurality of pixels 381 are denoted by reference numerals.

Each of the pixels 381 includes a photoelectric conversion unit (not shown), performs photoelectric conversion on light that is input from the outside, and outputs the charge obtained as a result of the photoelectric conversion to the vertical signal line 383.

Further, the operations of the respective pixels 381 are controlled by signals supplied from the scanning unit 388 via horizontal signal lines 389 and the vertical signal lines 383.

It should be noted that in FIG. 13, the vertical signal lines 383 are provided for each of columns of the pixels 381 arranged in the longitudinal direction, and only some of the vertical signal lines 383 are denoted by the reference numerals. In the same manner, in FIG. 13, the horizontal signal lines 389 are provided for each of rows of the pixels 381 arranged in the lateral direction, and only some of the horizontal signal lines 389 are denoted by the reference numerals.

The vertical signal lines 383 are wiring to transfer the charge accumulated in the pixels 381, more specifically, electric signals corresponding to the charge, to the horizontal selection circuit 385. The vertical signal lines 383 are wired along the pixels 381 arranged in the perpendicular direction. Based on a control signal and a vertical synchronizing signal, the vertical selection circuit 384 selects the pixel 381 on a row-by-row basis and sequentially performs scanning along the perpendicular direction.

Based on a control signal and a horizontal synchronizing signal, the horizontal selection circuit 385 selects the pixel 381 on a column-by-column basis and sequentially performs scanning along the horizontal direction. The horizontal selection circuit 385 sequentially selects the pixel 381 along the horizontal direction in synchronization with the scanning by the vertical selection circuit 384. The electric signal (charge) output from the pixel 381 is sequentially transferred to the horizontal selection circuit 385 via the vertical signal lines 383. The horizontal selection circuit 385 supplies the electric signals, which have been sequentially transferred, to the output circuit 387.

The scanning controller 386 generates the vertical synchronizing signal and the horizontal synchronizing signal based on a clock input from the outside or a clock generated by the scanning controller 386 itself and supplies the generated signals to the vertical selection circuit 384 and the horizontal selection circuit 385.

The scanning controller 386 generates the control signal. The pixels 381 to be sequentially scanned by the vertical selection circuit 384 and the horizontal selection circuit 385 are designated by the control signal. The scanning controller 386 supplies the generated signal to the vertical selection circuit 384 and the horizontal selection circuit 385.

The scanning controller 386 generates the vertical synchronizing signal, the horizontal synchronizing signal, and the control signal such that the electric signals of all of the pixels 381 are read out during one frame.

The output circuit 387 performs various types of signal processing on the electric signals sequentially supplied from the horizontal selection circuit 385, generates output signals of the respective pixels 381, and outputs the generated signals to a subsequent stage.

Also in the imaging device 371 configured as shown in FIG. 13, when the light-shielding part 91 and the light-shielding part 92 shown in, for example, FIG. 4 are provided to the pixels 381 provided in a certain region such as an ineffective pixel region, the characteristics of the photoelectric conversion units can be measured highly accurately as in the case of the imaging device 11.

In this example, the right end of the pixel 381 of FIG. 13 is an end to which the charge is transferred, that is, an end corresponding to the end facing the readout gate 22 in the imaging device 11, and the left end of the pixel 381 of FIG. 13 is an end corresponding to the end facing the channel stop region in the imaging device 11. Further, also in the pixel 381, a potential gradient may be provided to the photoelectric conversion unit.

Configuration Example of Imaging Apparatus

In addition, the present disclosure is applicable to any types of electronic apparatuses using a solid-state imaging device for a photoelectric conversion unit, such as imaging apparatuses including a digital still camera and a video camera, a mobile terminal apparatus having an imaging function, a copying machine using a solid-state imaging device for an image reading unit. The solid-state imaging device may have the form of one chip or the form of a module having an imaging function in which an imaging unit and a signal processing unit or an optical system are packaged.

Figure 14:
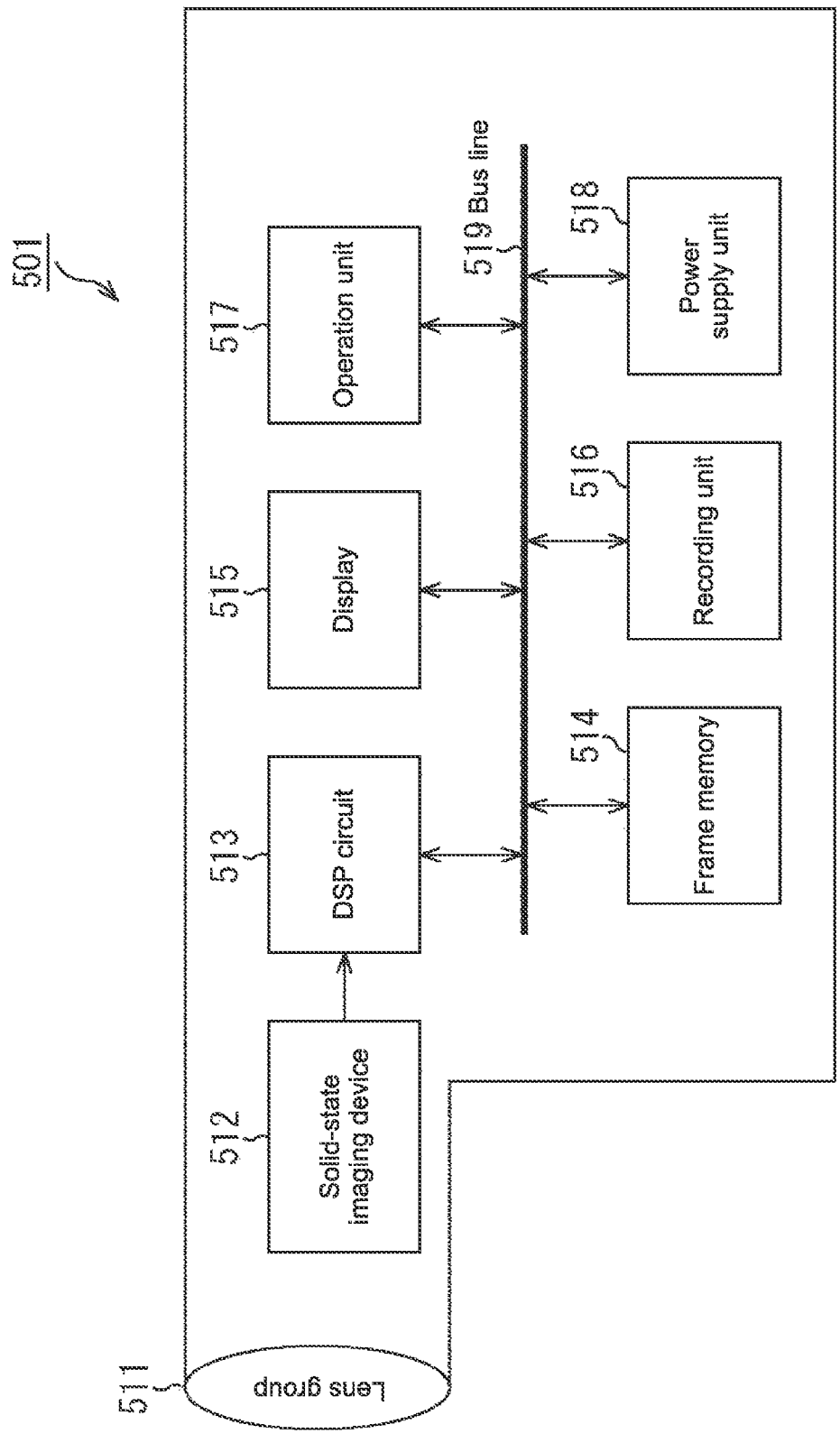
FIG. 14 is a diagram showing a configuration example of an imaging apparatus.

FIG. 14 is a diagram showing a configuration example of an imaging apparatus serving as an electronic apparatus to which an embodiment of the present disclosure is applied.

An imaging apparatus 501 of FIG. 14 includes an optical unit 511 constituted of a lens group and the like, a solid-state imaging device (imaging device) 512, and a DSP (Digital Signal Processing) circuit 513 serving as a camera signal processing circuit. Further, the imaging apparatus 501 includes a frame memory 514, a display 515, a recording unit 516, an operation unit 517, and a power supply unit 518. The DSP circuit 513, the frame memory 514, the display 515, the recording unit 516, the operation unit 517, and the power supply unit 518 are connected to one another via a bus line 519.

The optical unit 511 takes in incident light coming from a subject, i.e., an image light, and forms an image on an imaging surface of the solid-state imaging device 512. The solid-state imaging device 512 converts the amount of incident light, with which the image is formed on the imaging surface by the optical unit 511, into an electrical signal on a pixel-by-pixel basis. The solid-state imaging device 512 outputs the electrical signal as a pixel signal. The solid-state imaging device 512 corresponds to, for example, the imaging device 331 or imaging device 371 described above.

The display 515 is formed of, for example, a panel display such as a liquid crystal panel or an organic EL (Electro Luminescence) panel and displays moving images or still images captured by the solid-state imaging device 512. The recording unit 516 records the moving images or still images captured by the solid-state imaging device 512 on a recording medium such as a video tape and a DVD (Digital Versatile Disk).

The operation unit 517 issues operation commands on various functions of the imaging apparatus 501 under the operation of a user. The power supply unit 518 appropriately supplies various types of power, which serve as operation power of the DSP circuit 513, the frame memory 514, the display 515, the recording unit 516, and the operation unit 517, to those supply targets.

It should be noted that the embodiments of the present disclosure are not limited to the embodiments described above and can be variously modified without departing from the gist of the present disclosure.

Further, the present disclosure can have the following configurations.

(1) A solid-state imaging device, including:
a first pixel including a light-shielding part having an opening of a predetermined size; and
a second pixel including a light-shielding part having an opening of the predetermined size at a position different from a position of the opening of the first pixel.
(2) The solid-state imaging device according to (1), in which
the first pixel and the second pixel include pixels to measure characteristics of the solid-state imaging device.
(3) The solid-state imaging device according to (2), in which
the first pixel and the second pixel include pixels to measure sensitivity characteristics of the solid-state imaging device by comparing an output signal of the first pixel and an output signal of the second pixel.
(4) The solid-state imaging device according to any one of (1) to (3), in which
the first pixel and the second pixel are provided on an outside of an effective pixel region of the solid-state imaging device.
(5) The solid-state imaging device according to (4), in which
the first pixel and the second pixel are each provided on an edge portion of the solid-state imaging device.
(6) The solid-state imaging device according to any one of (1) to (5), in which
the first pixel and the second pixel are connected to a common circuit at a subsequent stage.
(7) The solid-state imaging device according to any one of (1) to (6), in which
the second pixel includes a plurality of second pixels.
(8) The solid-state imaging device according to any one of (1) to (7), in which
the first pixel includes a plurality of first pixels,
the second pixel includes a plurality of second pixels, and
the plurality of first pixels and the plurality of second pixels form a plurality of pairs.
(9) The solid-state imaging device according to any one of (1) to (8), in which
the opening of the first pixel is provided near the center of the light-shielding part, and
the opening of the second pixel is provided near an end of the light-shielding part.
(10) The solid-state imaging device according to any one of (1) to (8), in which
each of the first pixel and the second pixel of the solid-state imaging device includes a photoelectric conversion unit having a potential, a gradient being provided to the potential in a readout direction of charge obtained in the photoelectric conversion unit.
(11) The solid-state imaging device according to (10), in which
the opening of the second pixel has the same shape as a region having substantially the same potential in the photoelectric conversion unit and is provided at a position corresponding to the region.
(12) The solid-state imaging device according to (10), in which
the opening of the second pixel has the same shape as a boundary portion between regions having potentials different from each other in the photoelectric conversion unit and is provided at a position corresponding to the boundary portion.
(13) The solid-state imaging device according to (2), further including at least three pixels including the first pixel and the second pixel, the at least three pixels each including the light-shielding part including the opening, the openings of the at least three pixels being provided at positions different from one another.
(14) The solid-state imaging device according to any one of (1) to (13), in which
the solid-state imaging device includes an area sensor.
(15) An electronic apparatus, including
a solid-state imaging device including
a first pixel including a light-shielding part having an opening of a predetermined size, and
a second pixel including a light-shielding part having an opening of the predetermined size at a position different from a position of the opening of the first pixel.
(16) An inspection apparatus, including:
an acquisition unit configured to acquire an output signal of a first pixel and an output signal of a second pixel, the output signals being output from a solid-state imaging device including the first pixel and the second pixel, the first pixel including a light-shielding part having an opening of a predetermined size, the second pixel including a light-shielding part having an opening of the predetermined size at a position different from a position of the opening of the first pixel; and
a calculation unit configured to compare the output signal of the first pixel and the output signal of the second pixel and measure sensitivity characteristics of the solid-state imaging device.
(17) The inspection apparatus according to (16), further including
a determination unit configured to determine that a reduced sensitivity occurs in the pixel of the solid-state imaging device, when a ratio of the output signal of the first pixel and the output signal of the second pixel is a predetermined threshold value or smaller, the ratio being calculated as the sensitivity characteristics.
(18) The inspection apparatus according to (17), in which the threshold value is 0.9.
(19) The inspection apparatus according to (17), in which the threshold value is 0.5.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device, comprising:
   a first pixel including a first light-shielding part extending in a first direction, the first light-shielding part having an opening of a predetermined size, wherein a center of the opening of the first light-shielding part is provided at a center portion of the first pixel in the first direction such that the center of the opening of the first light-shielding part is centered between first and second end portions of the first light-shielding part in the first direction; and
   a second pixel including a second light-shielding part extending in the first direction, the second light-shielding part having an opening of the predetermined size, wherein a center of the opening of the second light-shielding part is provided near an end portion of the second pixel in the first direction such that the center of the opening of the second light-shielding part is closer to a first end portion of the second light-shielding part in the first direction and further from a second end portion of the second light-shielding part in the first direction,
   wherein characteristics of the imaging device are obtained based on an output signal from each of the first pixel and the second pixel.

2. The imaging device according to claim 1, wherein sensitivity characteristics of the imaging device are measured by comparing the output signal of the first pixel and the output signal of the second pixel.

3. The imaging device according to claim 1, wherein the first pixel and the second pixel are provided outside of an effective pixel region of the imaging device.

4. The imaging device according to claim 3, wherein the first pixel and the second pixel are each provided on an edge portion of the imaging device.

5. The imaging device according to claim 1, wherein the first pixel and the second pixel are connected to a common circuit.

6. The imaging device according to claim 1, wherein the second pixel is one of a plurality of second pixels.

7. The imaging device according to claim 1, wherein,
   the first pixel is one of a plurality of first pixels,
   the second pixel is one of a plurality of second pixels, and
   the plurality of first pixels and the plurality of second pixels form a plurality of pairs.

8. The imaging device according to claim 1, wherein each of the first pixel and the second pixel includes a photoelectric conversion unit having a potential, and a gradient being provided to the potential in a readout direction of charge obtained in the photoelectric conversion unit.

9. The imaging device according to claim 8, wherein the opening of the second light-shielding part has a same shape as a region in the photoelectric conversion unit and is provided at a position corresponding to the region.

10. The imaging device according to claim 1, further comprising a third pixel including a third light-shielding part having an opening located at a position different from a position of the opening in the first light-shielding part and the opening in the second light-shielding part.

11. The imaging device according to claim 1, wherein the imaging device includes an area sensor.

12. The imaging device according to claim 1, wherein each of the first pixel and the second pixel includes a photoelectric conversion unit and the second end portion of the second light-shielding part is a region near an opposite end of an end from which charge accumulated in the photoelectric conversion unit is read out.

13. The imaging device of claim 1, wherein the center of the opening of the second light-shielding part is closer to an interface between an N-type semiconductor region and a P-type semiconductor region than to a readout gate of a photoelectric conversion unit of the second pixel.

14. An electronic apparatus, comprising:
   an imaging device including:
      a first pixel including a first light-shielding part extending in a first direction, the first light-shielding part having an opening of a predetermined size, wherein a center of the opening of the first light-shielding part is provided at a center portion of the first pixel in the first direction such that the center of the opening of the first light-shielding part is centered between first and second end portions of the first light-shielding part in the first direction, and
      a second pixel including a second light-shielding part extending in the first direction, the second light-shielding part having an opening of the predetermined size, wherein a center of the opening of the second light-shielding part is provided near an end portion of the second pixel in the first direction such that the center of the opening of the second light-shielding part is closer to a first end portion of the second light-shielding part in the first direction and further from a second end portion of the second light-shielding part in the first direction, and characteristics of the imaging device are obtained based on an output signal from each of the first pixel and the second pixel; and
   an optical unit configured to form an image on an imaging surface of the imaging device.

15. The electronic apparatus according to claim 14, wherein sensitivity characteristics of the imaging device are measured by comparing the output signal of the first pixel and the output signal of the second pixel.

16. The electronic apparatus according to claim 14, wherein the first pixel and the second pixel are provided outside of an effective pixel region of the imaging device.

17. The electronic apparatus according to claim 14, wherein,
   the first pixel is one of a plurality of first pixels,
   the second pixel is one of a plurality of second pixels, and
   the plurality of first pixels and the plurality of second pixels form a plurality of pairs.

18. The electronic apparatus according to claim 14, wherein each of the first pixel and the second pixel includes a photoelectric conversion unit having a potential, and a gradient being provided to the potential in a readout direction of charge obtained in the photoelectric conversion unit.

19. The electronic apparatus according to claim 14, wherein each of the first pixel and the second pixel includes a photoelectric conversion unit and the second end portion of the second light-shielding part is a region near an opposite end of an end from which charge accumulated in the photoelectric conversion unit is read out.

20. The electronic apparatus according to claim 14, further comprising a third pixel including a third light-shielding part.

* * * * *